(12) United States Patent
Sellmer et al.

(10) Patent No.: US 6,494,221 B1
(45) Date of Patent: Dec. 17, 2002

(54) DEVICE FOR WET ETCHING AN EDGE OF A SEMICONDUCTOR DISK

(75) Inventors: Reinhard Sellmer, Österreich (DE); Robert Kumnig, Österreich (DE)

(73) Assignee: Sez AG (AT)

( * ) Notice: Subject to any disclaimer, the term of this patent is extended or adjusted under 35 U.S.C. 154(b) by 0 days.

(21) Appl. No.: 09/442,190

(22) Filed: Nov. 16, 1999

(30) Foreign Application Priority Data

Nov. 27, 1998 (DE) .......................... 198 54 743

(51) Int. Cl.[7] .................................. B08B 3/02
(52) U.S. Cl. .................. 134/147; 134/153; 134/902
(58) Field of Search ................... 134/147, 153, 134/902, 94.1, 95.3, 99.1, 103.1; 153/345

(56) References Cited

U.S. PATENT DOCUMENTS

| | | | | |
|---|---|---|---|---|
| 3,523,706 A | * | 8/1970 | Logue | |
| 3,597,289 A | * | 8/1971 | Kohl et al. | |
| 3,928,154 A | * | 12/1975 | Andrews | |
| 4,510,176 A | * | 4/1985 | Cuthbert et al. | |
| 4,732,785 A | * | 3/1988 | Brewer | |
| 4,903,717 A | * | 2/1990 | Sumnitsch | |
| 4,968,375 A | * | 11/1990 | Sato et al. | |
| 5,176,783 A | * | 1/1993 | Yoshiawa | |
| 5,349,978 A | * | 9/1994 | Sago et al. | |
| 5,494,849 A | * | 2/1996 | Iyer et al. | |
| 5,608,943 A | * | 3/1997 | Konishi et al. | |
| 5,618,380 A | * | 4/1997 | Siems et al. | |
| 5,641,391 A | | 6/1997 | Hunter et al. | |
| 5,688,411 A | * | 11/1997 | Kutsuzawa et al. | |
| 5,753,133 A | | 5/1998 | Wong et al. | |
| 5,783,097 A | | 7/1998 | Lo et al. | |
| 5,879,577 A | * | 3/1999 | Weng et al. | |
| 5,896,877 A | * | 4/1999 | Pirker | |
| 5,897,379 A | * | 4/1999 | Ulrich et al. | |
| 5,939,139 A | * | 8/1999 | Fujimoto | |
| 6,033,589 A | * | 3/2000 | Lin | |
| 6,063,232 A | * | 5/2000 | Terasawa et al. | |
| 6,079,428 A | * | 6/2000 | Anai | |
| 6,114,254 A | * | 9/2000 | Rolfson | |
| 6,117,778 A | * | 9/2000 | Jones et al. | |
| 6,309,981 B1 | * | 10/2001 | Mayer et al. | |

FOREIGN PATENT DOCUMENTS

| | | | |
|---|---|---|---|
| JP | 63-53926 | * | 3/1983 |
| JP | 150028 | * | 5/1992 |

* cited by examiner

*Primary Examiner*—Frankie L. Stinson
(74) *Attorney, Agent, or Firm*—Mark Kusner; Michael A. Jaffe

(57) ABSTRACT

The invention concerns a device for wet etching an edge of a semiconductor disk.

6 Claims, 1 Drawing Sheet

DEVICE FOR WET ETCHING AN EDGE OF A SEMICONDUCTOR DISK

Figure 1:
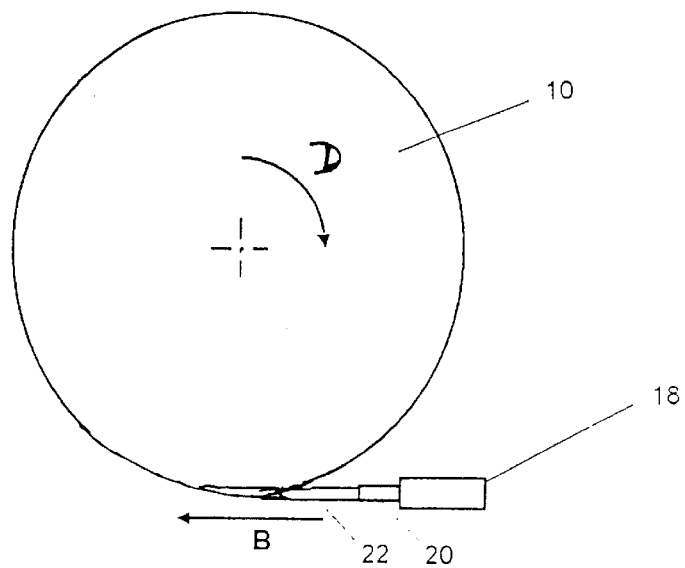

The invention concerns a device for wet etching an edge of a semiconductor disk.

Such devices are known from EP 0 297 648 B1 and EP 0 368 334 B1, for example.

For instance, for the production of chips on so-called smart cards (e.g. credit cards) or SIM cards (e.g. for mobile phones) the respective first products, the so-called wafers (semiconductor disks), having a thickness of 0.5 to 2 mm, for example, have to be reduced to a material thickness of 50 to 200 $\mu$m, for example.

This is effected, for example, by grinding and then polishing but also by thin etching by wet chemical methods.

The edge of the wafer being initially rounded has a wedge-like or arrow-like shape afterwards.

From that the problem results that in transport of the wafers, for example, other components as well as the edge of the wafer itself may be damaged by the correspondingly razor-sharp edge. This is particularly true, if the wafer is ground to the desired thickness, as microcracks (hair cracks) develop because of the high stress.

In order to "deburr" or "remove the sharpness of" the edge of a semiconductor, EP 0 297 648 B1 proposes to pass the rotating semiconductor disk at the edge portion thereof through a cushion impregnated with an acid, the edge being etched and partly removed thereby.

According to EP 0 368 334 B1, the same object is achieved through a device, wherein the periphery of the rotating wafer is guided against a groove of a rotating roller being coated with an etchant.

It is a disadvantage of both methods and devices that additional pieces of device (cushion, grooved roller) are required and a mechanical contact of the wafer edge and those additional pieces of device being necessary for removing the edge. In that, particles may penetrate off the cushion and contaminate the wafer, for example. In addition, irregularities may result in the very thin wafer edge by the mechanical contact.

Therefore, it is an object of the invention to provide a device of the type mentioned above, which allows to deburr (remove) wafer edges in a defined manner without the risk of soiling the wafer.

The basic idea of the invention is to direct an etching fluid selectively to the edge portion (edge region) to be treated of the wafer so that the etching fluid contacts only the wafer edge and no mechanical connection exists between the wafer edge and adjacent components.

First, in that context it would have suggested itself to direct the etching fluid vertically from above onto a wafer lying horizontally on a support and rotating. That technology proved to be of no use, because always the bottom of the wafer was undesirably etched as well. The reason for that seems to be that the acid diffuses (penetrates) into the wafer matrix, is heated by an exothermal reaction of the etching process and dissolves silicon out of the semiconductor disk on the bottom of the wafer.

Finally, it was found in extensive experiments that the object of the invention is achieved, if the etching fluid is directed onto the edge region of the wafer in the form of a jet which runs at an angle <90 and >0 degrees with respect to the plane of the semiconductor disk, particularly at an angle between 1 and 25 degrees.

Because of that "inclination" of the jet of etching fluid the etching fluid "softly" hits the wafer edge and is thrown off again in the direction of supply of the etching fluid after an extremely short time of treatment.

Moreover, that technology facilitates the supply of the jet of etching fluid to a defined surface portion of the edge of the semiconductor disk to be treated, which surface portion depends on the size of the etching jet and may be infinitesimally small.

In its most general embodiment, the invention concerns a device for wet etching the edge of a semiconductor disk, having the following features:

- a support having a support surface for receiving rotationally the semiconductor disk, as well as
- a nozzle disposed above the semiconductor disk, the mouth portion of which is designed and oriented so that a jet of etching fluid coming out of the mouth portion hits a defined surface portion of the edge of the semiconductor disk to be treated at an angle >0 and <90 degrees with respect to the plane of the semiconductor disk.

In principle, the nozzle or the mouth portion may be oriented radially with respect to the semiconductor disk. In this case, the etching fluid leaves the nozzle above the center of the semiconductor disk. Here, the mouth portion is oriented and the fluid pressure is adjusted so that the jet of fluid hits the wafer edge "from the center towards the outside" exactly in the edge region to be treated of the wafer.

According to another embodiment which proved to be particularly effective, the mouth portion of the nozzle is oriented so that the jet of etching fluid runs in a tangential direction with respect to the edge. In other words, the nozzle or its mouth portion is situated outside the semiconductor disk and the mouth portion is substantially oriented in a tangential direction with respect to the edge of the semiconductor disk. But here again the mouth portion is oriented so that the jet of etching fluid runs with an inclination of one of the angles mentioned above with respect to the plane of the semiconductor disk and hits the edge to be treated of the semiconductor disk.

The latter embodiment is explained in detail in the description of the figures below.

The nozzle or the mouth portion of the nozzle may be oriented so that the jet of etching fluid hits only a surface portion of the edge of the semiconductor disk, which faces the nozzle. So, the nozzle or the mouth portion is exactly positioned in such a manner that the jet of fluid completely hits the edge portion of the wafer and does not freely pass the wafer edge, not even part of it. In this way, an effect of the etching fluid as high as possible is achieved, on the one hand, and any risk of a so-called "undercut" (etching of the side of the wafer opposite the nozzle) is avoided, on the other hand. Finally, the whole used etching fluid may be collected again and recycled into the system in that way.

This holds particularly for the tangential supply described above of the jet of etching fluid which accordingly is thrown off the wafer edge in a tangential direction afterwards and may be collected.

The tangential or almost tangential supply of the etching fluid prevents any uncontrolled spraying-off of the etching fluid in hitting the wafer edge, because the etching fluid may be supplied in the direction of rotation of the wafer.

In this context, another embodiment of the invention proposes to form and position the nozzle so that the jet of etching fluid has a flow rate in hitting the edge of the semiconductor disk, which corresponds maximally to the peripheral velocity of the semiconductor disk.

Namely, it was surprisingly found that not only the shape of the etching jet affects the deburring of the wafer edge but also the pressure (the flow rate) of the etching fluid is substantial for an optimized deburring of the wafer edge.

Contrary to the supposition that a particularly high flow rate is advantageous it was found that the flow rate should be less, preferably up to ten times less than the peripheral velocity of the semiconductor disk. For that reason, also a laminar flow of the etching fluid is advantageous.

Starting out from conventional wafers having a diameter of 150 to 300 mm, for example, the mouth portion of the nozzle may have a diameter between 0.2 and 1.0 mm. While the peripheral velocity of the waver is usually about 20 m/s, the flow rate of the etching fluid should be between 90 and 50% below that.

According to an embodiment, the nozzle or its mouth portion is oriented so that the jet of the etching fluid hits the wafer edge at an angle between 1 and 25 degrees, with respect to the plane of the wafer.

Finally, the invention proposes to form the device having a support which has at least one nozzle leading into the support surface for receiving the semiconductor disk in accordance with the Bernoulli principle. For example, an appropriate support follows from EP 0 611 273 A1 or WO 97/03457. In this way, it is guaranteed that the bottom of the wafer, which faces the support, and also the support itself cannot be wetted by the etching fluid, i.e. not even, if the etching jet does not completely hit the upper side of the wafer edge, as described above.

Further characteristics of the invention follow from the features of the subclaims as well as the other application documents.

Figure 2:
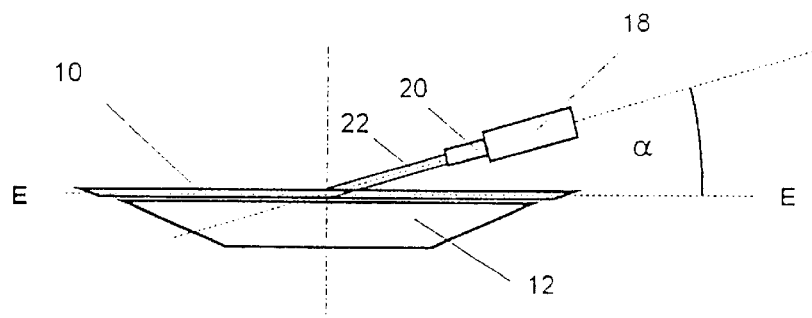
Figure 3:
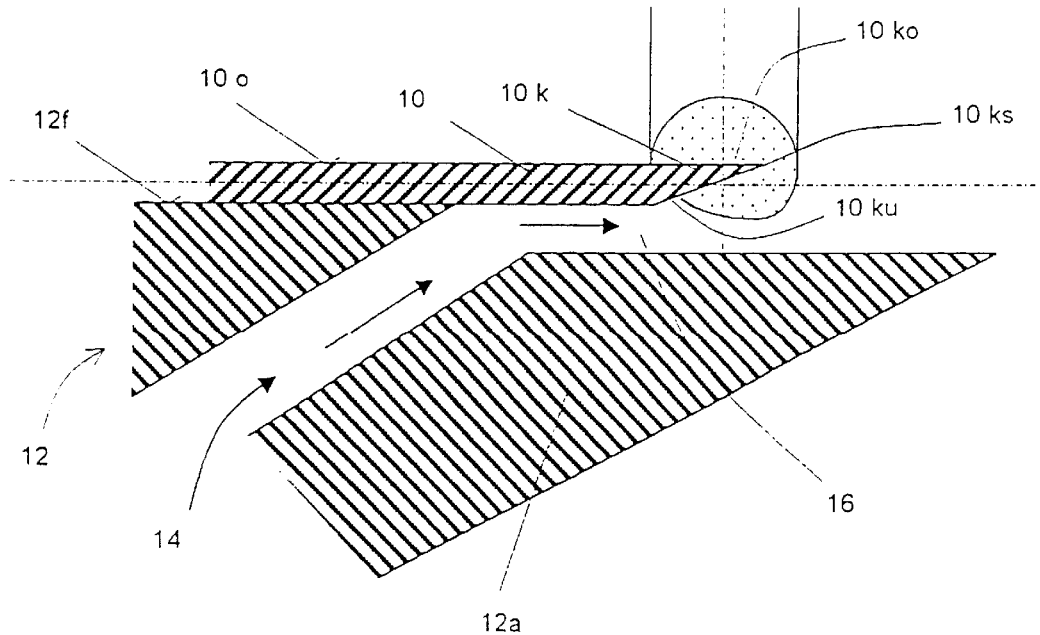

In the following explanation of the figures, which presents an embodiment, the figures show—each in a very schematic representation:

FIG. 1 a plan view of a device according to the invention,
FIG. 2 a side view of a device according to the invention,
FIG. 3 an enlarged sectional view of the device in the etch region of a wafer edge.

It follows from an overall view of FIGS. 1 to 3 that a very thin wafer disk 10 (here: having a thickness of 50 μm) is guided rotatably on a rotating support. Here, the wafer is exaggerated in thickness only for better illustration.

From FIG. 3, a typical geometry of the wafer in the edge region 10k at the periphery can be seen. While the upper side 10ko in the edge region 10k extends in alignment with the upper side 10o of the wafer 10 altogether, the bottom 10ku is formed having a bevel, resulting in a knife-like, sharp-edged profile having a point 10ks. According to FIG. 3, the support 12 has a ring nozzle 14 which leads into the support surface 12f thereof, on which the wafer 10 is guided. A gas flow, for example nitrogen, being led through the ring nozzle 14, flows out via the ring nozzle 14 and reaches an annular portion 16 which is formed between the wafer 10 and a lowered portion 12a of the support 12. A low pressure is formed in that annular portion 16 by the rapidly flowing gas, the wafer 10 being sucked against the support surface 12f of the support 12 thereby (so-called Bernoulli effect). The support illustrated in FIG. 3 is also called Bernoulli chuck.

A nozzle 18 is disposed above and outside the wafer 10, which has a mouth portion 20, an etching fluid under pressure coming out of it and—as shown in FIG. 3—being directed onto the upper side 10ko of the wafer edge 10k.

It follows from an overall view of FIGS. 1 and 2 that the direction B of flow of the etching fluid corresponds to the direction D of rotation of the wafer. Thereby, a "soft" hitting of the wafer edge 10k by the etching fluid is achieved.

Further, it follows from an overall view of FIGS. 1 and 2 that the nozzle 18 or the mouth portion 20 are oriented so that the jet 22 of etching fluid is directed at an angle alpha (here: 20 degrees) with respect to the plane E of the wafer 10 and is guided in tangential direction (FIG. 1) with respect to the wafer edge 10k at the same time.

In that the jet 22—contrary to the illustration of FIG. 3—may be directed selectively onto the upper side 10ko of the wafer edge 10k so that it completely hits the upper side 10ko (FIG. 1, 2) and there is no partial flow—as illustrated in FIG. 3—passing the point 10ks at the side.

In any case, the wafer edge 10k is etched off (broken), starting from the point 10ks, and its sharpness is thus removed in the desired defined manner.

The etching fluid being thrown off again afterwards because of the rotation of the wafer 10 may be collected in a receptacle (not illustrated) and may be recycled.

As an alternative to the described so called Bernoulli chuck the chuck may be provided with a channel, running out into support surface 12f and set under low pressure (partial vacuum) to fix the wafer.

A further alternative provides for a chuck, the support surface of which having a diameter less than the outer diameter of the wafer. By this it is avoided that any etching fluid passing the wafer edge will contact the chuck (support for said wafer) or that surface of the wafer opposite to said support surface respectively.

What is claimed is:

1. A device for removing an edge (10k) of a semiconductor disk (10) in a defined manner, which semiconductor disk having been treated previously by grinding and polishing or thin etching and providing a reduced thickness compared with a basic first wafer and microcracks along its edge, having the following features:

1.1 a support (12) having a support surface (12f) for receiving rotationally the semiconductor disk (10), as well as 1.2 a nozzle (18), disposed above the semiconductor disk (10), the mouth portion (20) of which is designed and oriented so that a jet (22) of etching fluid coming out of mouth portion (20) having a flow rate which corresponds maximally to the peripheral velocity of the semiconductor disk (10) runs in a tangential direction with respect to the edge (10k) of the semiconductor disk (10) and completely removes the edge (10k) of the semiconductor disk (10) and which faces the nozzle (18) at an angle >0 and <90 degrees with respect to the plane (E) of the semiconductor disk (10).

2. The device according to claim 1, wherein the support (12) has at least one nozzle (14, 16) leading into the support surface (12f) for receiving the semiconductor disk (10) in accordance with the Bernoulli principle.

3. The device according to claim 1, wherein the mouth portion (20) is formed and oriented so that the jet (22) of etching fluid coming out via the mouth portion (20) hits the edge (10k) of the semiconductor disk (10) to be treated at an angle between 1 and 25 degrees with respect to the plane (E) of the semiconductor disk (10).

4. The device according to claim 1, wherein the mouth portion (20) of the nozzle (18) has a diameter between 0.2 to 1.0 mm.

5. The device according to claim 1, wherein the support (12) is provided with a channel, running out into said support surface (12f) and being set under low pressure to fix the semiconductor disk (10).

6. The device according to claim 1, wherein said support (12) has a support surface (12f) the diameter of which being smaller than the outer diameter of the semiconductor disk (10).

* * * * *